(12) United States Patent
Tucker et al.

(10) Patent No.: US 6,663,674 B2
(45) Date of Patent: Dec. 16, 2003

(54) METHOD OF HANDLING A SILICON WAFER

(75) Inventors: Michael Thomas Tucker, Dallas, TX (US); Terry Breeden, Cedar Creek, TX (US); Stefan Ottow, Dresden (DE); Wolfram Köstler, Langerbrück (DE); Dan Wissel, Austin, TX (US)

(73) Assignees: Infineon Technologies SC300 GmbH & Co. KG, Dresden (DE); Infineon Technologies AG, Munich (DE); Motorola Inc., Schaumburg, IL (US)

( * ) Notice: Subject to any disclaimer, the term of this patent is extended or adjusted under 35 U.S.C. 154(b) by 0 days.

(21) Appl. No.: 10/126,372

(22) Filed: Apr. 19, 2002

(65) Prior Publication Data

US 2002/0173154 A1 Nov. 21, 2002

(30) Foreign Application Priority Data

Apr. 19, 2001 (EP) .......................................... 01109698

(51) Int. Cl.$^7$ ...................... H01L 21/302; H01L 21/461
(52) U.S. Cl. ......................... 638/757; 638/745; 638/787
(58) Field of Search ................................ 438/745, 757, 438/787, 791

(56) References Cited

U.S. PATENT DOCUMENTS 5,658,833 A    8/1997   Chen et al.

FOREIGN PATENT DOCUMENTS

| JP | 04 061 331 A | 2/1992 |
| JP | 10 189 782 | 7/1998 |
| TW | 350090 | * 12/1997 |
| TW | 350090 | 1/1999 |

* cited by examiner

Primary Examiner—Alexander Ghyka
(74) Attorney, Agent, or Firm—Laurence A. Greenberg; Werner H. Stemer; Gregory L. Mayback

(57) ABSTRACT

A recycling procedure for 300 mm nitride dummy wafers which have a stabilization layer of silicon dioxide is provided. The recycling procedure is essentially based on selectively wet etching the deposited silicon nitride with respect to the silicon dioxide stabilization layer, preferably with hot phosphoric acid at 160° C. In particular, a method of handling a silicon wafer which is employed as a dummy wafer during a nitride deposition process includes the steps of depositing a silicon dioxide layer on the wafer surface, performing the nitride deposition process on the wafer to deposit silicon nitride or silicon oxinitride on the wafer surface until a predetermined layer thickness is reached, and etching the silicon nitride or silicon oxinitride layer selectively with respect to the silicon dioxide layer.

7 Claims, 1 Drawing Sheet

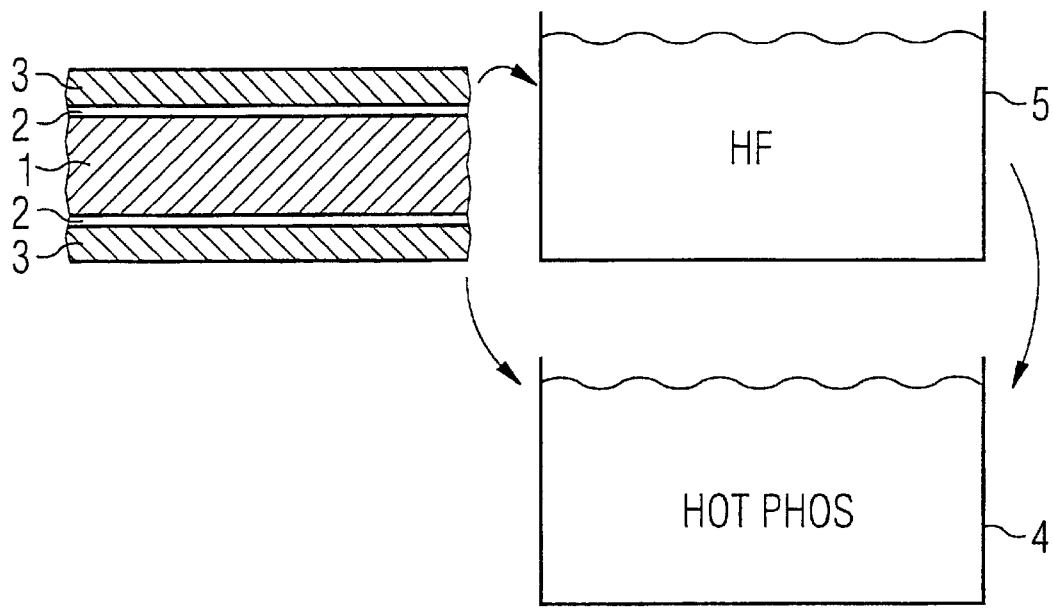
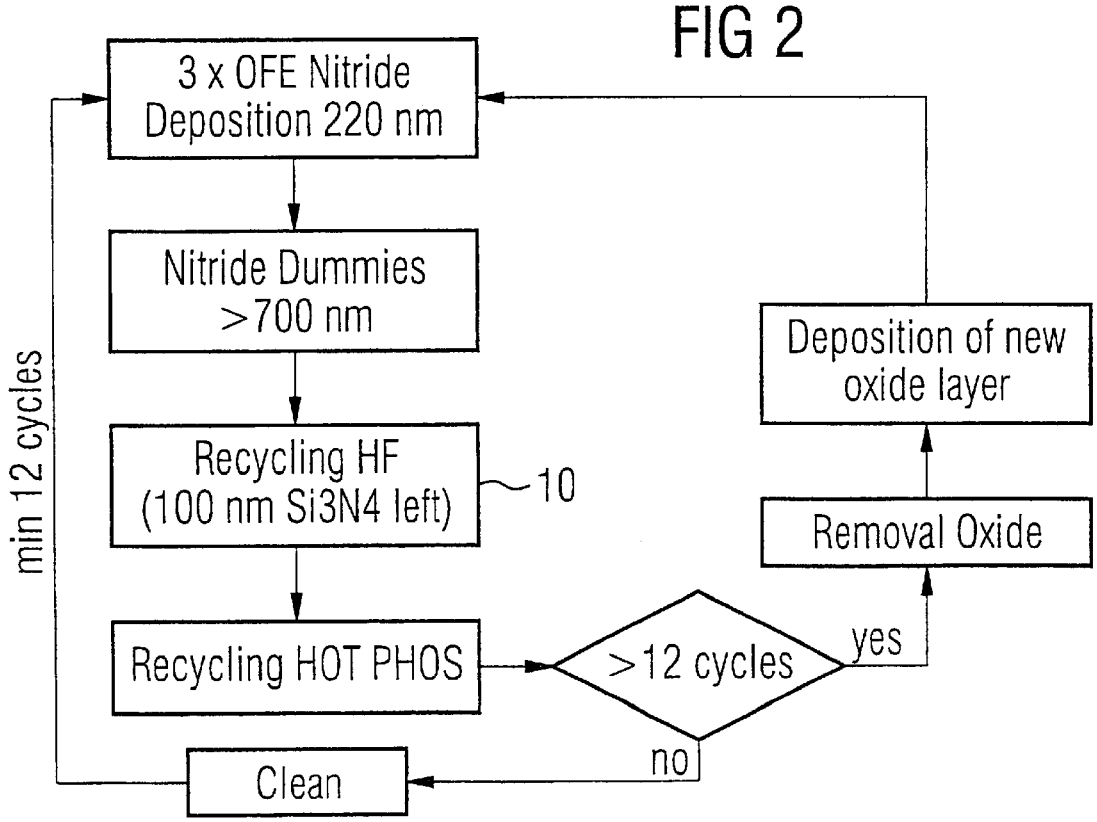

METHOD OF HANDLING A SILICON WAFER

BACKGROUND OF THE INVENTION

Field of the Invention

The invention relates to a method of handling a silicon wafer which is employed as a dummy wafer during a silicon nitride deposition process.

Usually, during a silicon nitride deposition process such as low-pressure chemical vapor deposition, a certain number (usually at least 100) of silicon wafers to be coated with the silicon nitride layer are held vertically in a slotted quartz boat and brought into the chemical vapor deposition reactor. At the ends of this reactor normally inhomogenous reaction conditions will prevail.

Therefore, the end positions of the slotted quartz boat are occupied by dummy wafers which are coated with the silicon nitride layer but which are not used for chip production. These dummy wafers are used for several silicon nitride deposition cycles and then they are recycled by etching the silicon nitride layer with hydrofluoric acid.

The recycling becomes necessary because the stability of the dummy wafers greatly decreases due to stress, slip lines etc. when the layer thickness has reached a certain value. As a consequence, wafer breaking becomes very likely to occur. However, wafer breaking is clearly undesirable because the particles generated contaminate the depostion tool and the production wafers. Broken wafers will largely inhibit the silicon nitride deposition on those wafers which will be used for chip production.

At present, dummy wafers are recycled by etching in concentrated hydrofluoric acid when the silicon nitride layer has reached a thickness of at least 700 nm. If required, a cleaning step for particles and metal contamination can be performed before releasing the wafers back to the furnace. Then, the dummy wafers are again used for silicon nitride deposition. This cycle is repeated until the entire number of cycles has been performed 7 times. Thereafter, the dummy wafer quality will be greatly deteriorated so that the probability of wafer breakage increases.

SUMMARY OF THE INVENTION

It is accordingly an object of the invention to provide a method of handling a silicon wafer and in particular a recycling process for a dummy wafer that increases the lifetime of the dummy wafer.

As stated above, the invention relates to a method of handling a silicon wafer which is employed as a dummy wafer during a silicon nitride deposition process. More specifically, the invention relates to a recycling procedure for 300 mm nitride dummy wafers which have been previously provided with a special stabilization layer made of silicon dioxide. The recycling procedure is essentially based on selectively wet etching the deposited silicon nitride with respect to the silicon dioxide stabilization layer, preferably with hot phosphoric acid at 160° C.

In the following, reference will be made to a silicon nitride deposition process as well as a silicon nitride layer. However, as is to be clearly understood, the deposition of silicon oxinitride as well as a silicon oxinitride layer are likewise to be encompassed by these terms. Moreover, the present invention not only refers to dummy wafers used during a low pressure chemical vapor deposition process but to dummy wafers during any kind of silicon nitride deposition process, especially plasma enhanced chemical vapor deposition.

With the foregoing and other objects in view there is provided, in accordance with the invention, a method of handling a silicon wafer, the method includes the steps of:

depositing a silicon dioxide layer on a surface of the silicon wafer;

performing a nitride deposition process on the silicon wafer employed as a dummy wafer during the nitride deposition process for depositing a nitride compound selected from the group of silicon nitride and silicon oxinitride on the surface of the silicon wafer until a nitride compound layer of a given layer thickness is achieved; and etching the nitride compound layer selectively with respect to the silicon dioxide layer.

In other words, according to the invention, the object of the invention is achieved by a method of handling a silicon wafer which is employed as a dummy wafer during a nitride deposition process, including the steps of depositing a silicon dioxide layer on the wafer surface, performing the nitride deposition process on the wafer to deposit silicon nitride or silicon oxinitride on the wafer surface until a predetermined layer thickness is reached, and etching the silicon nitride or silicon oxinitride layer selectively with respect to the silicon dioxide layer.

This new procedure allows to nearly double the number of cycles of nitride dummies in comparison to the hitherto used recycling process. Since due to the high wafer cost the increase of dummy wafer cycles is an important contribution for reducing cost in 300 mm manufacturing, the present invention is particularly useful for reducing the cost when 300 mm wafers are processed instead of 200 mm wafers.

As the inventors of the present invention surprisingly found out, the lifetime of a dummy wafer can be largely increased when the dummy wafer is coated with a silicon dioxide layer before depositing the silicon nitride layers. This is because a silicon dioxide layer will induce a kind of stress which will cause a bending of the wafer which is reverse to that caused by the silicon nitride layer. Both the stress of the silicon dioxide layer and the stress of the silicon nitride layer or the oxinitride layer preferably compensate each other.

The thickness of the silicon dioxide layer has to be appropriately chosen because the effect thereof will be too weak if the layer is too thin. More specifically, the thickness of the silicon nitride layer of different wafers may vary due to inhomogenous deposition conditions. Consequently, the silicon dioxide layer will be also etched, when the silicon nitride has been completely etched, since usually the etching agent used also etches the silicon dioxide layer, but at a much slower etching rate. Accordingly, if the silicon dioxide layer is chosen too thin, the silicon dioxide layer of some of the dummy wafers may be attacked and, thus, the stability of the dummy wafer may be deteriorated.

On the other hand, if the layer is too thick, the effect of the silicon dioxide stabilization layer will be too strong and, thus, cause an undesired amount of stress in the reverse direction. Accordingly, it is preferred that the silicon dioxide and the silicon nitride layers have a thickness ratio of approximately 1:5 to 1:10. The inventors found a layer thickness of the silicon dioxide layer of 70 to 150 nm to be appropriate.

According to the present invention, when a predetermined layer thickness of the silicon nitride layer is reached, the silicon nitride will be etched selectively with respect to the silicon dioxide layer. At the end of the etching step, the silicon nitride layer will be completely removed, while the silicon dioxide layer will not be etched or only to a small degree.

According to another mode of the invention, the etching step includes etching the nitride compound layer in a hot phosphoric acid bath. Hence, according to a preferred embodiment of the present invention, hot phosphoric acid ($H_3PO_4$, 85 wt-%) at approximately 160° C. is used for selectively etching the silicon nitride layer.

According to an especially preferred embodiment, the dummy wafers are etched in hydrofluoric acid before etching in hot phosphoric acid. In this case, since hydrofluoric acid does not selectively etch silicon nitride with respect to silicon dioxide, the etching time in hydrofluoric acid has to be appropriately chosen so that only the predominant part of the silicon nitride layer is etched with hydrofluoric acid. Accordingly, the etching time is chosen so that a silicon nitride layer thickness of about 100 nm or a thickness equal to that of the silicon dioxide layer will remain after the hydrofluoric etching step. By adding the etching step in hydrofluoric acid, the etching time of the silicon nitride layer can be remarkably reduced with respect to the embodiment according to which the silicon nitride layer is etched in hot phosphoric acid only.

In summary, the present invention provides a largely improved recycling process for nitride dummy wafers by which the number of cycles as well as the wafer stability can be greatly increased.

As a consequence, the dummy wafers can be used for a longer period of time thus reducing the cost, and they will be less likely to break. More specifically, as the inventors found out, the cost of the recycling process of the dummy wafers can be reduced by at least 30% at the present wafer price and deposition conditions for wafers of 300 mm (millimeter) in diameter.

In particular, if according to a preferred embodiment the predominant part of the silicon nitride layer is etched in hydrofluoric acid before etching in the hot phosphoric acid bath, additionally a short process time will be achieved. Consequently, the method of present invention involves all advantages of the hitherto used method and, in addition, the cost of the recycling process are remarkably reduced and the stability of the dummy wafers is remarkably enhanced.

According to a further mode of the invention, the nitride compound layer is etched when the nitride compound layer is between 700 nm and 1000 nm thick.

According to yet a further mode of the invention, the steps of performing the nitride deposition process on the silicon wafer as the dummy wafer until the given layer thickness is reached and of etching the nitride compound layer are repeated several times.

According to another mode of the invention, subsequent to etching the nitride compound layer in the hot phosphoric acid bath for at least 10 times, preferably 13 times and most preferably between 12 and 15 times, the silicon dioxide layer is removed and a new silicon dioxide layer is deposited prior to repeating the steps of performing the nitride deposition process on the silicon wafer as the dummy wafer and of etching the nitride compound layer.

Other features which are considered as characteristic for the invention are set forth in the appended claims.

Although the invention is illustrated and described herein as embodied in a method of handling a silicon wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic illustration for explaining the process of treating a dummy wafer according to the invention; and FIG. 2 is a flow diagram illustrating the process flow according to a preferred embodiment of the method according to the invention.

DESCRIPTION OF THE PREFERRED EMBODIMENTS

Referring now to the figures of the drawings in detail and first, particularly, to FIG. 1 thereof, there is shown a silicon wafer 1 which is employed as a dummy wafer during the nitride deposition process. Before the first nitride layer will be deposited, the dummy wafer will build up an additional 100 nm silicon dioxide layer 2 ($SiO_2$) on both surfaces thereof. The deposition of silicon dioxide on both surfaces of the dummy wafer is due to the vertical position of the dummy wafer in the reactor. This silicon dioxide layer 2 can for example be generated by thermal oxidation. As mentioned above, the layer thickness of the silicon dioxide layer 2 can be best selected in relation to the silicon nitride layer 3 ($Si_3N_4$) which is to be deposited. In the present embodiment, a layer thickness of 100 nm which corresponds to the typical layer thickness deposited during a normally performed thermal oxidation process is chosen.

The purpose of the silicon dioxide layer 2 is stress compensation and stabilisation of wafers against breakage. In particular, the deposition of a silicon nitride layer will induce mechanical and thermal stress of the wafer. Moreover, when the dummy wafer will be recycled in hot phosphoric acid at approximately 160° C., thermal stress will also be induced so that wafer breakage could very easily occur when the silicon dioxide layer 2 is not present. Additionally, the silicon dioxide layer 2 serves as an etch stop layer during the etching step in hot phosphoric acid which will be performed later.

Thereafter, the nitride deposition process, for example low-pressure chemical vapor deposition, is performed and the dummy wafer is coated with a silicon nitride layer 3 on both surfaces thereof, because both surfaces are exposed when the dummy wafer is vertically held in the chemical vapor deposition reactor. At a typical layer thickness of 200 to 220 nm of the nitride being deposited during one standard deposition process, the dummy wafer 1 can be used for three subsequent deposition processes until a silicon nitride layer thickness of 700 nm has been reached. At a silicon nitride layer thickness of 1000 nm at most, the dummy wafer should be recycled since otherwise wafer breakage due to stress might occur.

When the silicon nitride layer on the dummy wafer has reached a certain thickness, according to a first embodiment of the invention, the silicon nitride will be removed in a hot phosphoric acid bath 4 (HOT PHOS) at a concentration of 85 wt.-% (weight percent) with an etching rate of about 5 nm/min at 160° C. The silicon dioxide layer serves as an etch stop layer because the selectivity of $Si_3N_4/SiO_2$ in hot phosphoric acid is at least 40:1. This means that the etching time is selected such that the silicon surface of the dummy wafer is always covered by the oxide and therefore protected against etching with phosphoric acid.

Thereafter, optionally, the dummy wafer can be subjected to a cleaning step with $H_2O_2$, $NH_3$ and $H_2O$ at 35° C. or 65°

C. for removing impurities and particles left from the etching process before releasing the dummy wafers back to the furnace for further silicon nitride deposition processes.

The lower etch rate achieved with etching in hot phosphoric acid compared to hydrofluoric acid results in longer process times compared with the recycling process with hydrofluoric acid. However, it has been shown that it is possible to cycle wafers at least 12 times with this process which is almost twice the amount reached with the hydrofluoric acid only process. In some cases wafers were cycled 15 or even considerably more times without deterioration of the wafer quality.

Another problem associated with the use of hot phosphoric acid as an etching agent is that due to the large amount of etching products generated during the etching process of the thick silicon nitride layers crystallisation of the etching product will occur whereby the filters used for etching in hot phosphoric acid will be blocked. However, as the inventors found out, this problem can be solved when the filters are removed from the etching tank.

According to a second preferred embodiment of the present invention the process flow of which is depicted in FIG. 2, the predominant part of the silicon nitride layer on the dummy wafer is etched with hydrofluoric acid 5 (HF) before etching with hot phosphoric acid 4. Typically, a 49% hydrofluoric acid 5 having an etching rate of 17 nm/min at 25° C. and an etching rate of 34 nm/min at 35° C. is used. By changing the temperature of the hydrofluoric acid bath 5, the etching rate can be adjusted. Since the etching rate of silicon nitride in hydrofluoric acid is much higher than that in hot phosphoric acid, according to the second preferred embodiment, the etching time and, thus, the throughput of the dummy wafers can be significantly increased.

After the dummy wafers have been cycled a certain number of about 12 to 15 cycles according to any embodiment of the present invention, they can be used in a second loop with a new oxide layer. Accordingly, the silicon dioxide layer will be completely removed from the dummy wafer and a new silicon dioxide layer will be deposited. Thereafter, the recycled wafer can be again used like a new dummy wafer in a nitride deposition process.

Thereby, the complete number of cycles for which the dummy wafers are used can further be increased and, thus, the cost can be reduced more efficiently.

Alternatively, after 12 to 15 cycles the dummy wafer can be supplied to a reclaim process.

As described above the first and second embodiments of the invention differ in the use of a recycling step with hydrofluoric acid. While the first embodiment does not include the HF step, the second embodiment does. Thus a process flow for the first embodiment can be derived from FIG. 2 by omitting the HF recycling step 10.

We claim:

1. A method of handling a silicon wafer, the method which comprises:

depositing a silicon dioxide layer on a surface of the silicon wafer;

performing a nitride deposition process on the silicon wafer employed as a dummy water during the nitride deposition process for depositing a nitride compound selected from the group consisting of silicon nitride and silicon oxinitride on the surface of the silicon wafer until a nitride compound layer of a given layer thickness is achieved; and etching the nitride compound layer selectively with respect to the silicon dioxide layer by:
        initially etching part of the nitride compound layer in hydrofluoric acid, and
        subsequently etching the nitride compound layer in a hot phosphoric acid bath.

2. The method according to claim 1, which comprises providing a ratio of a thickness of the silicon dioxide layer and the given layer thickness of the nitride compound layer such that the ratio is between 1:5 and 1:10.

3. The method according to claim 1, which comprises etching the nitride compound layer when the nitride compound layer is between 700 nm and 1000 nm thick.

4. The method according to claim 1, which comprises repeating several times the steps of performing the nitride deposition process on the silicon wafer as the dummy wafer until the given layer thickness is reached and of etching the nitride compound layer.

5. The method according to claim 1, which comprises subsequent to etching the nitride compound layer in the hot phosphoric acid bath for at least 10 times, removing the silicon dioxide layer and depositing a new silicon dioxide layer prior to repeating the steps of performing the nitride deposition process on the silicon wafer as the dummy wafer and of etching the nitride compound layer.

6. The method according to claim 1, which comprises subsequent to etching the nitride compound layer in the hot phosphoric acid bath for at least 13 times, removing the silicon dioxide layer and depositing a new silicon dioxide layer prior to repeating the steps of performing the nitride deposition process on the silicon wafer as the dummy wafer and of etching the nitride compound layer.

7. The method according to claim 1, which comprises subsequent to etching the nitride compound layer in the hot phosphoric acid bath between 12 and 15 times, removing the silicon dioxide layer and depositing a new silicon dioxide layer prior to repeating the steps of performing the nitride deposition process on the silicon wafer as the dummy water and of etching the nitride compound layer.

* * * * *

UNITED STATES PATENT AND TRADEMARK OFFICE
CERTIFICATE OF CORRECTION

PATENT NO. : 6,663,674 B2  Page 1 of 1
DATED : December 16, 2003
INVENTOR(S) : Michael Thomas Tucker et al.

It is certified that error appears in the above-identified patent and that said Letters Patent is hereby corrected as shown below:

<u>Title page,</u>
Item [75], should read as follows:
-- Michael Thomas Tucker, Dallas, TX
  (US); Terry Breeden, Cedar Creek, TX
  (US); Stefan Ottow, Dresden (DE);
  Wolfram Köstler, Langebrück (DE);
  Dan Wissel, Austin, TX (US) --

Signed and Sealed this

Twenty-seventh Day of April, 2004

JON W. DUDAS
*Acting Director of the United States Patent and Trademark Office*